US011418005B2

(12) United States Patent
Siriani et al.

(10) Patent No.: US 11,418,005 B2
(45) Date of Patent: Aug. 16, 2022

(54) VARIABLE CONFINEMENT HYBRID OSCILLATOR POWER AMPLIFIER

(71) Applicant: Cisco Technology, Inc., San Jose, CA (US)

(72) Inventors: Dominic F. Siriani, Lansdale, PA (US); Vipulkumar K. Patel, Breinigsville, PA (US); Jock T. Bovington, La Mesa, CA (US); Matthew J. Traverso, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 245 days.

(21) Appl. No.: 16/581,923

(22) Filed: Sep. 25, 2019

(65) Prior Publication Data

US 2021/0091529 A1   Mar. 25, 2021

(51) Int. Cl.
| | | |
|---|---|---|
| *H01S 5/00* | (2006.01) | |
| *H01S 5/026* | (2006.01) | |
| *H01S 3/23* | (2006.01) | |
| *H01L 31/0304* | (2006.01) | |
| *G02B 6/12* | (2006.01) | |
| *H01S 5/14* | (2006.01) | |
| *H01S 5/10* | (2021.01) | |
| *H01S 5/50* | (2006.01) | |

(Continued)

(52) U.S. Cl.
CPC ............... *H01S 5/026* (2013.01); *G02B 6/12* (2013.01); *H01L 31/0304* (2013.01); *H01S 3/2308* (2013.01); *H01S 5/0287* (2013.01); *H01S 5/1082* (2013.01); *H01S 5/141* (2013.01); *H01S 5/50* (2013.01); *H01S 5/021* (2013.01)

(58) Field of Classification Search
CPC ...... H01S 3/2308; H01S 5/1082; H01S 5/141; H01S 5/0287; H01S 5/50; H01S 5/026; H01S 5/021
See application file for complete search history.

(56) References Cited

U.S. PATENT DOCUMENTS

| | | | |
|---|---|---|---|
| 5,003,550 A * | 3/1991 | Welch | H01S 5/42 372/102 |
| 8,994,004 B2 * | 3/2015 | Bowers | B82Y 20/00 257/21 |
| 9,274,275 B2 | 3/2016 | Webster et al. | |

(Continued)

FOREIGN PATENT DOCUMENTS

EP   2854241 A2   4/2015

OTHER PUBLICATIONS

Kaspar et al., Packaged hybrid III-V/silicon SOA, ECOC (2014) [Abstract Only].

(Continued)

*Primary Examiner* — Kinam Park
(74) *Attorney, Agent, or Firm* — Patterson + Sheridan, LLP

(57) ABSTRACT

Described herein is a two chip photonic device (e.g., a hybrid master oscillator power amplifier (MOPA)) where a gain region and optical amplifier region are formed on a III-V chip and a variable reflector (which in combination with the gain region forms a laser cavity) is formed on a different semiconductor chip that includes silicon, silicon nitride, lithium niobate, or the like. Sides of the two chips are disposed in a facing relationship so that optical signals can transfer between the gain region, the variable reflector, and the optical amplifier.

20 Claims, 6 Drawing Sheets

(51) Int. Cl.
  *H01S 5/028* (2006.01)
  *H01S 5/02* (2006.01)

(56) References Cited

U.S. PATENT DOCUMENTS

| | | | | |
|---|---|---|---|---|
| 10,320,151 | B1* | 6/2019 | Traverso | H01S 5/101 |
| 2007/0058685 | A1 | 3/2007 | O'Daniel et al. | |
| 2007/0189688 | A1 | 8/2007 | Dehlinger et al. | |
| 2008/0273567 | A1* | 11/2008 | Yariv | H01S 5/1032 372/50.1 |
| 2010/0158429 | A1 | 6/2010 | Popovic | |
| 2014/0079082 | A1* | 3/2014 | Feng | H01S 5/021 372/20 |
| 2015/0092800 | A1* | 4/2015 | Zucker | H01S 5/06808 372/29.015 |
| 2015/0277036 | A1 | 10/2015 | Jiang et al. | |
| 2019/0089132 | A1* | 3/2019 | Soda | H01S 5/141 |
| 2020/0280171 | A1* | 9/2020 | Siriani | H01S 5/2031 |

OTHER PUBLICATIONS

Zhang et al., Quantum dot SOA/silicon external cavity multi-wavelength laser, Opt. Exp., 23, 4666 (2015).
Zilkie et al., Power-efficient III-V/Silicon external cavity DBR lasers, Opt. Exp., 20, 23456 (2012).
Klamkin et al., High-output saturation power variable confinement slab-coupled optical waveguide amplifier, OFC/NFOEC, Los Angeles, CA (2011). [Abstract Only].
Tohmori et al., Spot-size converted 1.3 um laser with butt-jointed selectively grown vertically tapered waveguide, Electron. Lett., 31, 1069 (1995). [Abstract Only].
Budd et al., Semiconductor optical amplifier (SOA) packaging for scalable and gain-integrated silicon photonic switching platforms, ECTC, San Diego, CA (2015). [Abstract Only].
Tuorila et al., Low loss GaInNaAs/GaAs gain waveguides with U-bend geometry for single-facet coupling in hybrid photonic integration, Appl. Phys. Lett., 113, 041104 (2018). [Abstract Only].
Nikita Yu. Gordeev, Alexey S. Payusov, Yuri M. Shernyakov, Sergey A. Mintairov, Nikolay A. Kalyuzhnyy, Marina M. Kulagina, and Mikhail V. Maximov,"Transverse single-mode edge-emitting lasers based on coupled waveguides," Optics Letters, vol. 40, Issue 9, pp. 2150-2152 (2015).
U.S. Appl. No. 16/751,994 "Optical Waveguide Emitter With Turning Waveguide Section," filed Jan. 24, 2020.
PCT International Search Report for Application No. PCT/US2020/020372 dated May 26, 2020.
PCT Notification of Transmittal of the International Search Report and the Written Opinion of the International Searching Authority, or the Declaration for Application No. PCT/US2020/024716 dated Jul. 10, 2020.
Amnon Yariv et al., "Supermode Si/III-V hybrid lasers, optical amplifiers and modulators: A Proposal and Analysis," Optics Express, vol. 15, No. 15, Jul. 11, 2007, pp. 9147-5273.
Kasper van Gasse et al., "27 dB gain III-V-on-Silicon Semi-Conductor optical amplifier with > 17 dBm Output Power," Optics Express, vol. 27, No. 1, Jan. 4, 2019, p. 293.
Gordeev et al., "Transverse single-mode edge-emitting lasers based on coupled waveguides," Opt. Lett., 40, 2150, 2015.
I. Moerman, P. Van Daele, and P. Demeester, "A review on fabrication technologies for the monolithic integration of tapers with III-V semiconductor devices," IEEE J. Select. Topics Quantum Electron., vol. 3, No. 6, pp. 1308-1320, 1997.
Juodawlkis et al., "High-power, low-noise 1.5-um slab-coupled optical waveguide (SCOW) emitters: physics, devices, and applications," IEEE J Sel. Top. Quant. Electr., 17, 1698, 2011.
Kobayashi et al., "Silicon photonic hybrid ring-filter external cavity wavelength tunable lasers," JLT, 33, 1241-1246, 2015. (Abstract Only).
Maximov et al., "High-performance 640-nm-range GaInP—AlGaInP lasers based on the longitudinal photonic bandgap crystal with narrow vertical beam divergence," IEEE J. Quant. Electr., 41, 1341, 2005.
Menon et al., "Photonic Integration Using Asymmetric Twin-Waveguide (ATG) Technology: Part II—Devices," IEEE J. Sel. Top. Quant. Electr., 11, 30, 2005.
Miah et al., "Astigmatism-free high-brightness 1060 nm edge-emitting lasers with narrow circular beam profile," Opt. Exp., 24, 30514, 2016.
O'Brien et al., "Operating characteristics of a high-power monolithically integrated flared amplifier master oscillator power amplifier," IEEE JQE, 29, 2052-2057, 1993.
Pietrzak et al., "Combination of low-index quantum barrier and super large optical cavity designs for ultranarrow vertical far-fields from high-power broad area lasers," IEEE J. Sel. Top Quant. Electr., 17, 1715, 2011.
Qiu et al., "Design and fabrication of low beam divergence and high kink-free power lasers," IEEE J. Quant. Electr., 41, 1124, 2005.
U.S. Appl. No. 16/294,634, "Supermode Filtering Waveguide Emitters," filed Mar. 6, 19.
U.S. Appl. No. 16/366,756, "Variable-Confinement Monolithic Master Oscillator Power Amplifier," filed Mar. 27, 2019.
Wenzel et al., "10 W continuous-wave monolithically integrated master-oscillator power-amplifier," Electronics Letters, 43, 160-161, 2007.
Xia et al., "Photonic Integration Using Asymmetric Twin-Waveguide (ATG) Technology: Part I—Concepts and Theory," IEEE J. Sel. Top. Quant. Electr., 11, 17, 2005.
Zhao et al., "High Power Indium Phosphide Photonic Integrated Circuits," Manuscript received Feb. 1, 2019, IEEE, 11 Pages.
Xia et al. "Photonic Integration Using Asymmetric Twin-Waveguide (ATG) Technology: Part I-Concepts and Theory", IEEE Journal of Selected Topics in Quantum Electronics, vol. 11, No. 1, pp. 17-29 (2005). (Year: 2005).
PCT, International Preliminary Report on Patentability for Application PCT/US2020/020372 dated Aug. 25, 2021.

* cited by examiner

VARIABLE CONFINEMENT HYBRID OSCILLATOR POWER AMPLIFIER

TECHNICAL FIELD

Embodiments presented in this disclosure generally relate to a hybrid master oscillator power amplifier (MOPA) where a laser source and an optical amplifier are inline.

BACKGROUND

Coherent modulation formats are of primary interest for long-haul and metro applications, and are gaining increased attention for shorter-reach and data center interconnect (DCI) applications. However, coherent modulators are inherently high-loss due to modulating both phase and amplitude. For upcoming 600 G, 800 G, and 1 TB applications, the transmitter insertion loss of the coherent modulators is estimated at 25-29 dB. Meanwhile, the required transmitter output power into the optical fiber is between 0 and +3 dBm. To meet this requirement, an Integrated Tunable Laser Assembly (ITLA) would need to achieve +25 to 30 dBm output, or up to 1 Watt. Such a laser is prohibitive from both a cost and power consumption point of view. Currently, only a laser with +18 dBm output power is available.

An inline amplifier (e.g., micro Erbium-doped fiber amplifier (EDFA)) can be used to relax the required input power from the laser. However, adding the inline amplifier introduces excess noise into the modulated signal, which can significantly reduce transmission distance. Moreover, no more than 3-4 dB of gain is achievable due to noise introduced by the inline amplifier.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
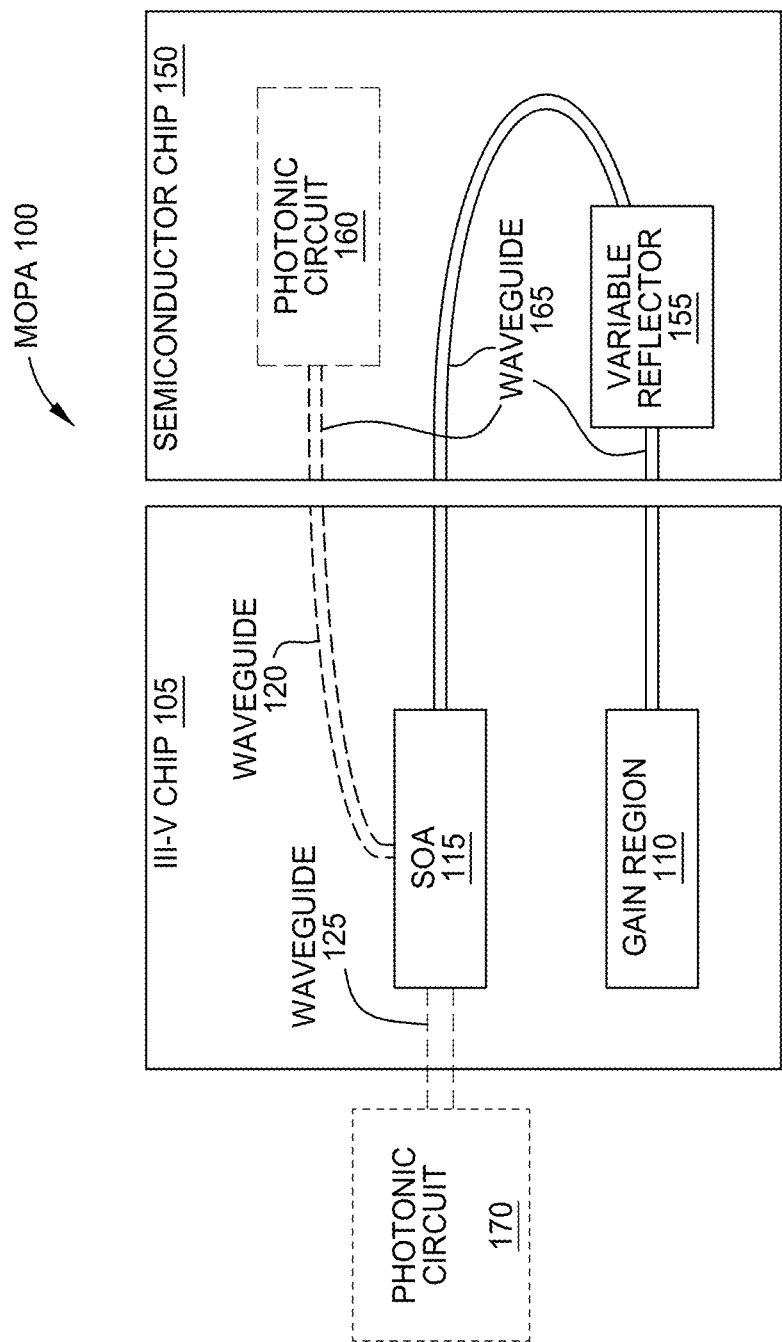
FIG. 1 illustrates a MOPA containing multiple semiconductor chips, according to one embodiment described herein.

One embodiment presented in this disclosure is a photonic device that includes a III-V semiconductor chip comprising a gain region configured to generate an optical signal and an optical amplifier configured to amplify the optical signal. The photonic device also includes a semiconductor chip comprising a variable reflector, wherein an input of the variable reflector is optically coupled to an output of the gain region and an output of the variable reflector is optically coupled to an input of the optical amplifier.

Another embodiment presented herein is a photonic device that includes a III-V semiconductor chip comprising a gain region configured to generate an optical signal and an optical amplifier configured to amplify the optical signal. The photonic device also includes a semiconductor chip comprising a variable reflector optically disposed between the gain region and the optical amplifier such that the optical signal generated by the gain region passes through the variable reflector to reach the optical amplifier.

Another embodiment presented herein is a photonic device that includes a first semiconductor chip comprising a gain region configured to generate an optical signal and an optical amplifier configured to amplify the optical signal. The device also includes a second semiconductor chip with a side in a facing relationship with the first semiconductor chip, the second semiconductor chip comprising a variable reflector optically disposed between the gain region and the optical amplifier such that the optical signal generated by the gain region passes through the variable reflector to reach the optical amplifier.

EXAMPLE EMBODIMENTS

Laser sources for semiconductor photonics face many challenges that include scaling to high power (which is required for higher data rates), coupling light from the laser chip (usually a III-V semiconductor) onto a photonic chip (e.g., silicon), optical losses when coupling to external chips, expensive fabrication from complex structures or processes, and limited flexibility and tunability. The embodiments herein describe a two chip MOPA solution where a gain region and an optical amplifier are formed on a III-V chip and a variable reflector (which in combination with the gain region forms a laser) is formed on a different chip that includes silicon, silicon nitride, lithium niobate, or the like. The MOPA can be referred to as a hybrid since its optical components are disposed on two different types of semiconductor chips. Doing so overcomes or mitigates some or all of the challenges listed above.

In one embodiment, the gain region in the III-V chip is optically coupled to the variable reflector in a different chip (e.g., a silicon chip) to form a laser that generates a continuous wave (CW) optical signal. The output of the variable reflector is in turn coupled to an optical amplifier in the III-V chip. The output of the optical amplifier can then be optically coupled to other photonic circuitry—e.g., a transmitter, optical modulator, and the like. A two-chip hybrid solution permits the gain region and the optical amplifier to be formed in the III-V chip using a simplified, high-yield fabrication process. In contrast, the variable reflector which often requires a relatively more complex fabrication process can be formed on a silicon chip using fabrication techniques designed for silicon photonics. By dividing the MOPA into two chips, the gain region and the optical amplifier can be formed using much simpler, higher-yielding processes relative to a MOPA where the gain region, variable reflector, and the optical amplifier are all formed in the same III-V chip.

In one embodiment, the gain region and the optical amplifier in the III-V chip are formed using supermode filtering waveguides (SFW). The SFW includes two waveguides (an etched and unetched waveguide) stacked on each other that are separated by an intermediate spacer layer. The fundamental mode is confined and guided in the etched waveguide whereas the higher order modes (i.e., all the other modes) are coupled to, and filtered out by, the unetched waveguide. By controlling the width of the unetched waveguide, the SFW can make a single optical mode with a large spot size (which is ideal for coupling light between the two chips in the MOPA or for increasing the saturation power to get higher power out of the amplifier) or a single mode primarily confined in the unetched waveguide that includes an active region for increasing the modal gain (which is ideal for the gain region and a low-power, high-gain optical amplifier in the III-V chip).

FIG. 1 illustrates a MOPA 100 formed in an optical system containing multiple semiconductor chips, according to one embodiment described herein. In this embodiment, the MOPA 100 (which is one example of a photonic device) is formed using optical components disposed on a III-V chip 105 and a semiconductor chip 150 which can be a silicon chip, a semiconductor substrate with a layer of lithium niobate, or a semiconductor substrate with a layer silicon nitride. In one embodiment, the semiconductor chip 150 can contain a combination of silicon and lithium niobate or silicon nitride and multiple layers of any of these materials. In one embodiment, rather than a semiconductor chip 105, lithium niobate can form a substrate on which the variable reflector 155 is disposed. Thus, the embodiments herein are not limited to the semiconductor chip 150 but can include any substrate separate from the III-V chip 105 that is suitable for the variable reflector 155. The III-V chip 105 can include a combination of III-V semiconductor materials.

The III-V chip 105 includes a gain region 110 which generates an optical signal (e.g., a CW signal) using an active region. In one embodiment, the gain region 110 is formed from a SFW, which is described in more detail in FIG. 2. Although not shown, the III-V chip 105 includes a high reflective (HR) element for reflecting optical signals received in a first direction from the gain region 110. The various implementations of the HR element are described in more details in the embodiments below.

The HR element for the gain region 110 reflects the optical signal towards a variable reflector 155 disposed in the semiconductor chip 150. That is, the gain region 110 is coupled to a waveguide 165 in the semiconductor chip 150 that is in turn coupled to the variable reflector 155. In general, the variable reflector 155 can be any optical structure which reflects some of the optical signal received by the gain region 110 but allows the rest of the optical signal to pass through. In some embodiments, the variable reflector 155 is formed using rings or gratings that serve as frequency filters and reflect some of the optical signal back towards the gain region 110 while the remaining portion of the optical signal passes through the reflector 155. The combination of the gain region 110 and the variable reflector 155 can be considered as a laser, or a light source, that has a laser cavity that extends from the HR element coupled to the gain region 110 to the variable reflector 155. In one embodiment, forming the variable reflector 155 using rings may be preferred because of the long length of the laser cavity formed by the gain region 110 and the variable reflector 155.

Longer length cavities results in longitudinal modes becoming closer together which means the variable reflector 155 should be a finer filter. In one embodiment, the variable reflector 155 is a planar lightwave circuit (PLC).

The light outputted by the variable reflector 155 (e.g., the light that is output by the laser formed by the combination of the gain region 110 and the variable reflector 155) is transmitted by a waveguide 165 to an side, edge, or facet of the semiconductor chip 150 which is in a facing relationship with a corresponding side, edge, or facet of the III-V chip 105. This light passes from the semiconductor chip 150 back into the III-V chip 105 and then enters a semiconductor optical amplifier (SOA) 115 which amplifies the power of the optical signal generated by the laser. This inline arrangement of the laser (e.g., the gain region 110 and the variable reflector 155) with the SOA 115 forms the MOPA 100.

In one embodiment, the SOA 115 is formed from a SFW that has an active region for increasing the power or intensity of the optical signal. The output of the SOA 115 can then be optionally coupled to a waveguide 125 or to a waveguide 120. As shown, the waveguide 120 terminates at a side or facet of the III-V chip 105 and is aligned to an optional waveguide 165 in the semiconductor chip 150. This waveguide 165 is in turn optically coupled to a photonic circuit 160. This circuit 160 can be a modulator, transceiver, or any other photonic element which uses an amplified, CW optical signal.

Alternatively, the output of the SOA 115 may be coupled to the waveguide 125 which is coupled to a photonic circuit 170 at another facet of the III-V chip 105. Like the photonic circuit 160, the circuit 170 can be a modulator, transceiver, or any other photonic element which uses an amplified, CW optical signal. Thus, FIG. 1 illustrates different arrangements, using the ghosted lines, for coupling the MOPA 100 to a photonic circuit. In one embodiment, the output of the SOA 115 is coupled to a photonic circuit 160 that is in the same chip 150 that includes the variable reflector 155. However, in another embodiment, the output of the SOA 115 is coupled to a photonic circuit separate from the III-V chip 105 and the semiconductor chip 150. For example, the photonic circuit 170 may be formed on a different semiconductor chip. In one embodiment, the III-V chip 105 and the semiconductor chip 150 (and a chip containing the photonic circuit 170) may be disposed on a common optical bench or substrate so that their sides or facets can be aligned to transfer optical signals as shown in FIG. 1.

As mentioned above, the fabrication process for forming the variable reflector 155 may be relatively more complex than the processes used for forming the gain region 110 and the SOA 115. By dividing the MOPA 100 into two chips, the gain region 110 and the SOA 115 can be formed using a much simpler, higher-yielding process relative to a MOPA where the gain region 110, variable reflector 155, and the SOA 115 are all formed in the same chip (e.g., III-V semiconductor chip). Forming these optical components on separate chips in a hybrid MOPA can reduce fabrication costs and improve yield.

Figure 2:
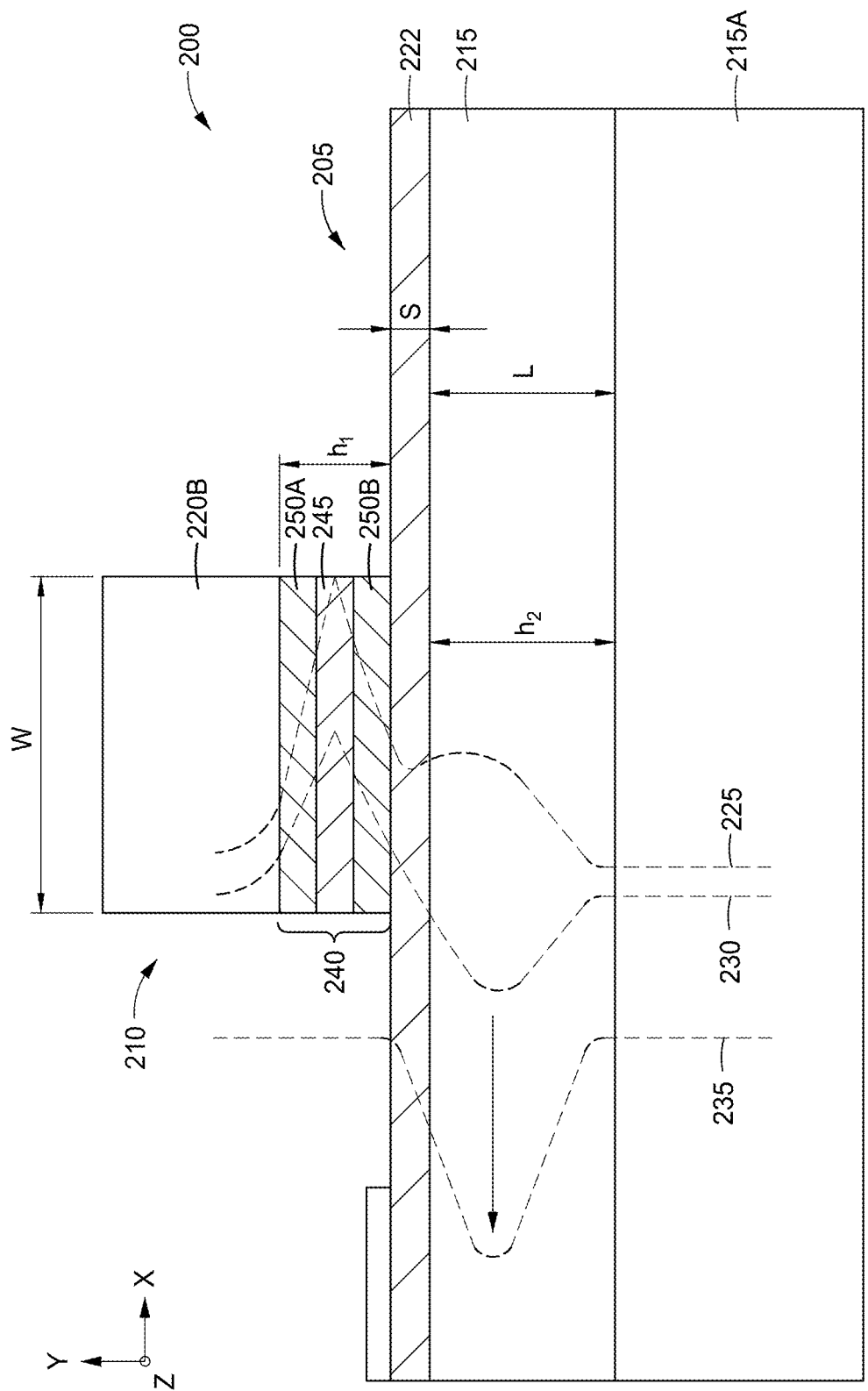
FIG. 2 is a cross-sectional view of a supermode filtering waveguide, according to one or more embodiments.

FIG. 2 is a cross-sectional view of a SFW 200, according to one or more embodiments. The SFW 200 may be used in conjunction with other embodiments, such as being used to form the gain region 110 and the SOA 115 depicted in FIG. 1.

The SFW 200 includes a ridge portion 210 that extends from a base portion 205. Generally, the base portion 205 is significantly wider (e.g., along the x-dimension) than the ridge portion 210. As shown, the ridge portion 210 comprises a second optical waveguide 240 and part of a second cladding layer 220B. The base portion 205 comprises a first optical waveguide 215 arranged above the first cladding layer 220A. The first optical waveguide 215 is configured to extend indefinitely (or for a distance much wider than the ridge) in the lateral dimension (e.g., along the x-dimension). The width of the ridge portion 210 may change depending on the desired function of the SFW 200 which is described in more detail in FIGS. 3 and 4A-4B below.

The first optical waveguide 215 may have any suitable implementation. For example, where the first cladding layer 220A comprises an indium phosphide (InP) semiconductor material, the first optical waveguide 215 may be formed of gallium indium arsenide phosphide (GaInAsP), aluminum gallium indium arsenide (AlGaInAs), or another suitable quaternary compound semiconductor material. In another example, where the first cladding layer 220A comprises an aluminum gallium arsenide (AlGaAs) semiconductor material, the first optical waveguide 215 may be formed of gallium arsenide (GaAs), AlGaAs with a lower proportion of aluminum, and so forth.

The first optical waveguide 215 has a total thickness (t) along the y-dimension. In some embodiments, and as depicted in FIG. 2, the first optical waveguide 215 comprises a single optical waveguide layer arranged above the first cladding layer 220A and having a height ($h_2$) along the y-dimension. In some embodiments, the height ($h_2$) of the single optical waveguide layer equals the total thickness (t) of the first optical waveguide 215, but this is not a requirement. In other examples, the first optical waveguide 215 can have two optical waveguide layers separated by a spacer layer, or the first optical waveguide 215 can have an alternating arrangement of high-index and low-index optical waveguide layers (e.g., a dilute waveguide).

The ridge portion 210 comprises a second optical waveguide 240 that is spaced apart from the first optical waveguide 215. The second optical waveguide 240 may have any suitable implementation. For example, where the second cladding layer 220B comprises an InP semiconductor material, the second optical waveguide 240 may be formed of GaInAsP, AlGaInAs, or another suitable quaternary compound semiconductor material. In another example, where the second cladding layer 220B comprises an AlGaAs semiconductor material, the second optical waveguide 240 may be formed of GaAs, AlGaAs with a lower proportion of aluminum, and so forth. In some embodiments, the second optical waveguide 240 is implemented with a same material as the first optical waveguide 215, but this is not a requirement.

In some embodiments, and as shown in the SFW 200, an optically active region 245 is disposed in the second optical waveguide 240. In alternate embodiments, the active region 245 is disposed in the first optical waveguide 215. Any suitable optical gain material(s) may be used in the optically active region 245, such as quantum wells, quantum dots, quantum wires, etc., which may be electrically pumped and/or optically pumped.

The first waveguide 215 and the second waveguide 240 are spaced apart by a spacer layer 220, and form an evanescently coupled waveguide arrangement. As shown, the first optical waveguide 215 and the second optical waveguide 240 are "vertically stacked", although other relative arrangements are also possible. As such, the effective refractive indices of the modes of the independent first optical waveguide 215 and the second optical waveguide 240 should be appropriately chosen to create a desired supermode that is selectively propagated by the SFW 200. The effective refractive indices can be varied by changing a geometry of the first optical waveguide 215 and/or the second optical waveguide (e.g., a width and thickness) or materials (bulk refractive indices). The materials and thickness of the spacer layer 220 also may be chosen to affect the supermode properties. The arrangement of the first waveguide 215 and the second waveguide 240 can (and generally will) support a plurality of supermodes. However, by virtue of the design of the SFW 200, a fundamental supermode is confined in the ridge portion 210, and all of the other (unwanted) supermodes are filtered out by radiating into the lateral extent of the first optical waveguide 215. Thus, a single mode may be selectively propagated by the SFW 200.

Referring also to FIG. 2, the first waveguide stratum 250A represents a first region that is doped with a first conductivity type, and the second waveguide stratum 250B represents a second region that is doped with a different, second conductivity type. The active region 245 (e.g., a quantum dot layer) is disposed between the first waveguide stratum 250A and the second waveguide stratum 250B. The first optical waveguide 215 may have any suitable doping or may be undoped.

In some embodiments, the waveguide layer 240 is formed from a III-V semiconductor material or alloy, and has a thickness between about 1 and 2 microns. In some embodiments, a width of the ridge portion 210 ($w$) along the x-dimension is between about 3 and 8 microns. With such dimensioning, a diameter of the optical mode may be about 4 and 5 microns, which is much larger than most SOAs that support single mode amplification. As the mode size increases, the optical signal typically has multiple modes. However, the SFW 200 can have a large mode size and still support single mode amplification because of the filtering function of the waveguide 215. As an optical signal propagating in the SFW 200 generates additional modes, these modes are transmitted into, and filtered out by, the waveguide 215 in the lateral direction (the left and right directions along the x-axis). In this manner, the SFW 200 supports single mode operation at larger mode sizes supported by other SOAs. In one embodiment, the SFW 200 is a multi-mode amplifier with a vertical mode size of the fundamental mode greater than 2.5 microns $1/e^2$ diameter, which can have significantly higher mode gain than any other higher order modes. In one embodiment, the SFW 200 is a single-mode amplifier with a mode size of the fundamental mode greater than 2.5 microns $1/e^2$ diameter; other modes supported by the waveguide experience a net loss because of the radiation loss in the waveguide 215. The relationship $1/e^2$ is a typical metric for describing the size of a Gaussian beam.

A spacer layer 222 is disposed between the first optical waveguide 215 and the second optical waveguide 240. The spacer layer 222 may have any suitable implementation, such as InP or a suitable quaternary compound semiconductor material. Further, the spacer layer 222 may have any suitable doping or may be undoped. The spacer layer 22 has a height(s) along the y-dimension.

The first optical waveguide 215, the second optical waveguide 240, and/or the spacer layer 222 are dimensioned and arranged such that the first optical waveguide 215 and the second optical waveguide 240 are evanescently coupled. Through the evanescent coupling, the combination of the first optical waveguide 215 and the second optical waveguide 240 propagate a coupled supermode representing a sum of the modes of the first optical waveguide 215 and the second optical waveguide 240.

In some embodiments, the second optical waveguide 240 is configured to propagate a plurality of optical modes (illustrated as effective index plots 225, 230, 235), and the first optical waveguide 215 is configured to selectively propagate a first mode of the plurality of optical modes. Described another way, a fundamental coupled mode (illustrated by the effective index plot 225) has an effective index that is greater than that of the first optical waveguide 215, and higher-order coupled modes (illustrated by the effective index plots 230, 235) have effective indexes that are less than that of the first optical waveguide 215. The effective index is greater for a fundamental coupled mode in a region corresponding to the ridge portion 210 of the SFW 200. The effective index is lesser for higher-order coupled modes in the ridge portion 210. Thus, the fundamental coupled mode (e.g., an in-phase optical mode) is confined by the first optical waveguide 215, while the higher-order coupled modes (e.g., out-of-phase optical modes) are radiated away (i.e., filtered) by the first optical waveguide 215 as shown by the arrow in FIG. 2.

According to the coupled mode theory for evanescently coupled waveguides, the coupled system of two waveguides supports two supermodes (an in-phase mode and an out-of-phase mode) whose field profiles are approximately described by the superposition of the individual waveguide modes. The effective indices of these modes can be described by the equations $n_{eff}^+ = n[\Delta n^2 + K^2]^{1/2}$ (in-phase) and $n_{eff}^- = n - [\Delta n^2 + K^2]^{1/2}$ (out-of-phase), where n is the effective indices of the two waveguides averaged, $\Delta n$ is the half the difference of the two waveguides' effective indices, and K is related to the coupling strength between the two waveguides. For the SFW 200 in the region where the upper waveguide 240 is etched away, the mode effective index is approximately equal to the effective index of the lower waveguide(s) alone, which is expressed as $n_{eff}^I = n + /- \Delta n$ (sign depending on how the difference between waveguide effective indices is taken). It is apparent that $n_{eff}^+ > n_{eff}^I > n_{eff}^-$ for $K^2 > 0$. Since in general a mode is pulled into the region with higher refractive index, it follows that the in-phase mode is confined in the ridge portion 210, whereas the out-of-phase mode is pulled into the lateral region (with upper waveguide etched away) where it radiates away from the ridge portion 210 and the optical power is lost. By this principle, the desired in-phase mode is confined to the ridge portion 210, while the unwanted out-of-phase supermode is filtered out by radiating away.

Figure 3:
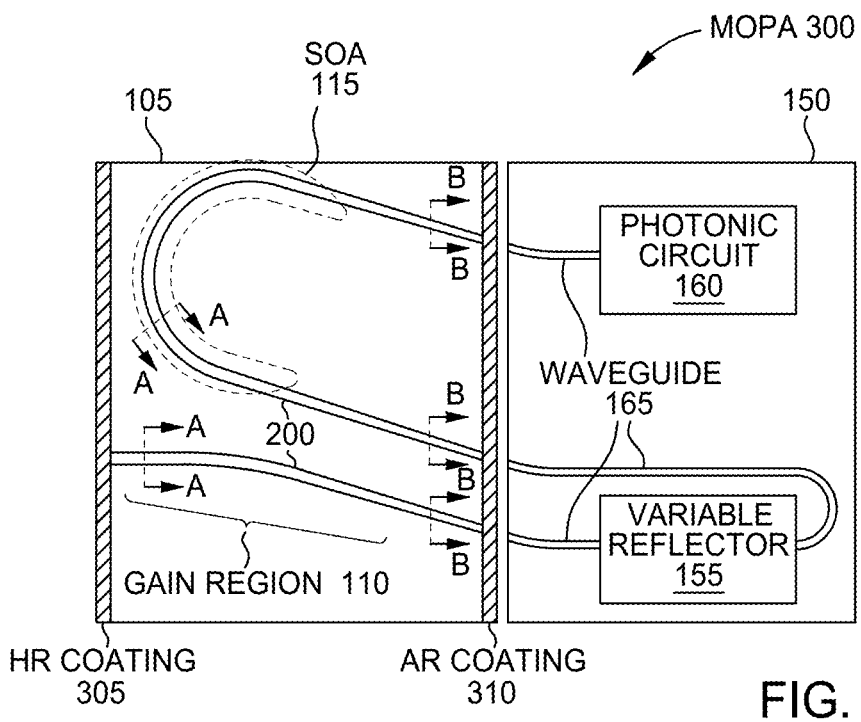
FIG. 3 illustrates a MOPA formed using two semiconductor chips, according to one embodiment described herein.

FIG. 3 illustrates a MOPA 300 formed using dual chips, according to one embodiment described herein. Like in FIG. 1, the MOPA 300 includes the III-V chip 105 and the semiconductor chip 150 with optically aligned facets or sides. The III-V chip 105 contains the gain region 110 and the SOA 115 which are formed using the SFW 200 described in FIG. 2. As shown, the SFW for the gain region 110 extends from a HR coating 305 (one example of a HR element) disposed on the left facet of the chip 105 while a second, opposite end of the SFW terminates at an opposite facet of the chip 105 which includes an anti-reflective (AR) coating 310. As shown, the width of the ridge portion of the SFW is wider in the gain region 110 than in the portion of the SFW that is near the AR coating 310. This change in width is illustrated by the cross section indicators A-A (which is within the gain region 110) and B-B (which is outside of the gain region 110 and where the SFW optically couples to a waveguide in the semiconductor chip 150).

Figure 4A:
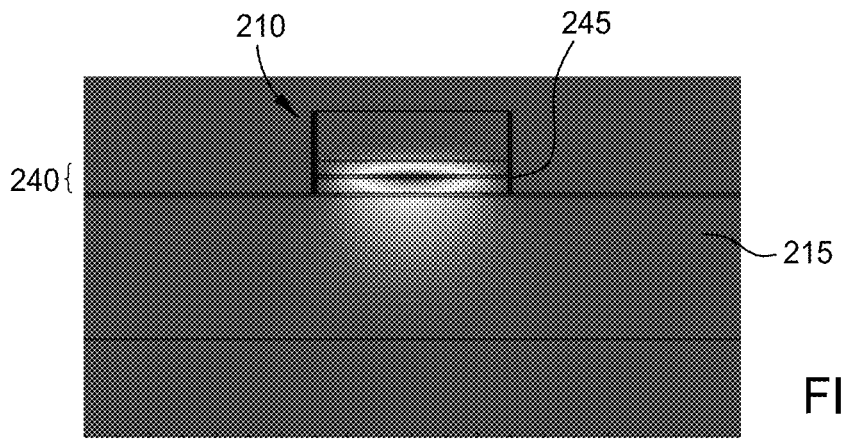
FIGS. 4A and 4B illustrate cross sections of supermode filtering waveguides used in the MOPA in FIG. 3, according to one embodiment described herein.
Figure 4B:
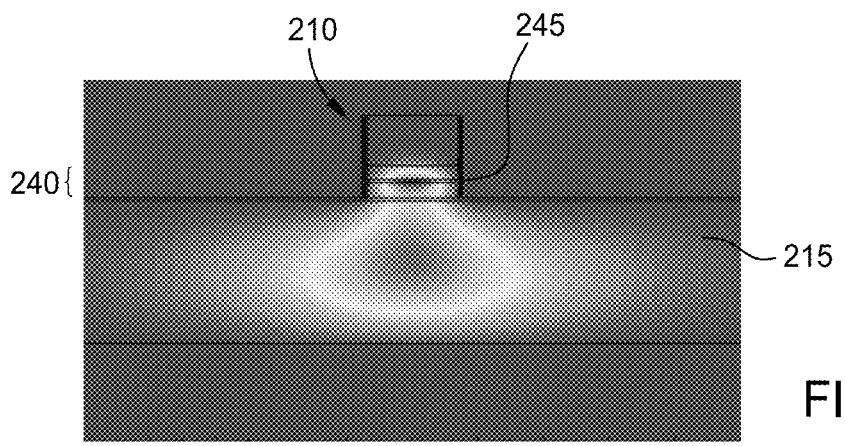

FIGS. 4A and 4B illustrate cross sections of SFW 200 used in the MOPA 300 in FIG. 3, according to one embodiment described herein. Specifically, FIG. 4A illustrates the cross sections A-A of the SFW in FIG. 3 while FIG. 4B illustrates the cross sections B-B. As shown, the width of the ridge portion 210 and the second optical waveguide 240 in FIG. 4A is larger than the width of the ridge portion 210 and the waveguide 240 in FIG. 4B. FIGS. 4A and 4B also illustrate a gradient representing the location of the fundamental mode of the optical signal. In FIG. 4A, the highest concentration of the fundamental mode is in the second optical waveguide 240. This is due to the width of the ridge portion 210. The wider width confines most of the fundamental mode within the waveguide 240. As a result, the active region 245 increases the intensity of the optical signal. Thus, the width of the SFW within the gain region 110 is greater which helps to generate the optical signal for the laser.

However, while the width of the ridge portion 210 in FIG. 4A is optimized for generating the laser source, the optical signal has a small mode size which makes coupling the optical signal to the semiconductor chip 150 inefficient. Instead, as shown in FIG. 4B, the width of the SFW 200 is decreased at the cross section B-B which forces much of the fundamental mode out of the second optical waveguide 240 and into the first optical waveguide 215. Doing so increases the size of the fundamental mode, e.g., from a few microns (or smaller) to between 4-15 microns. As a result, the coupling efficiency between the III-V chip 105 and the semiconductor chip 150 is improved. So long as the change in width of the ridge portion 210 (and the second optical waveguide 240) is done adiabatically, the majority of the optical signal remains confined in the fundamental mode as the size of the fundamental mode increases or decreases as the width of the ridge portion 210 varies.

Beneficially, the large size of the optical mode allows for better coupling efficiency and alignment tolerance, which enables passive alignment and bonding of the SFW 200 in the III-V chip 105 to a corresponding waveguide in the semiconductor chip 150. The waveguides 165 in the semiconductor chip 150 can be any type of waveguides (e.g., silicon, silicon nitride, or silicon oxy-nitride). Further, although not shown, the semiconductor chip 150 can include an optical coupler (e.g., a prong coupler) for exchanging optical signals with the SFW in the III-V chip 105. Further, the large size of the optical mode in the SFW 200 in FIG. 4B permits generation of very high optical power levels, e.g., 100 milliwatts to 1 watt or greater, which is approximately an order of magnitude greater than conventional diode lasers. Further, the amplification generated by the SFW 200 can compensate for the higher losses suffered when data rates are increased. For example, the SFW 200 can be used in a transmitter that has an optical signal greater than 50 GHz and supporting data rates between 100 Gbps and 1 Tbps.

Returning to FIG. 3, the combination of the HR coating 305, the gain region 110, the AR coating 310, and the variable reflector 155 from a laser and its corresponding cavity. As mentioned above, while the variable reflector 155 reflects some of the light received from the gain region 110 back towards the III-V chip, the remaining light in the optical signal is transmitted via one of the waveguides 165 to the same facet in the III-V chip 105 that was used to transfer the optical signal to the variable reflector 155. There, the optical signal transfers to another SFW in the III-V chip where the SFW has a cross-section B-B as illustrated in FIG. 4B. As above, the narrow width of the ridge portion 210 means the size of the fundamental mode is larger, thereby improving coupling efficiency. Further, the waveguide 165 in the semiconductor chip 150 can have an optical coupler that also adiabatically increases the mode size of the optical signal before it is transferred from the chip 150 back to the chip 105.

The width of the SFW increases adiabatically as the SFW approaches the SOA 115. There, the SFW has a width according to the cross section A-A as illustrated in FIG. 4A. As a result, much of the fundamental mode is confined in the second optical waveguide 240 and thus is amplified by the active region 245. The SOA 115 may also be referred to as a U-SOA since the SFW makes a U-turn in the III-V chip 105.

In one embodiment, the active region 245 is powered (or biased using a voltage) along the entire length of the two SFWs in the III-V chip 105. That is, the portions of the SFWs that are not within the SOA 115 or the gain region 110 (e.g., the portions of the SFWs near the AR coating 310) may have powered active regions 245. Thus, these portions of the SFWs may still amplify the optical signal, but the amount of amplification may be smaller relative to the portions of the SFWs in the gain region 110 and the SOA 115 where the width of the ridge portion 210 is wider and the fundamental mode is confined primarily in the second optical waveguide 240.

Alternatively, some portions of the SFWs may be unpowered (no bias voltage is applied to the active regions), or the SFWs may not have an active region 245. Put differently, the portions of the SFW in the III-V chip 105 outside of the gain region 110 and the SOA 115 may be unpowered (or passive), or may be fabricated to omit the active regions.

After the optical signal passes through the SOA 115, the width of the ridge portion 210 in the SFW again decreases in order to increase the size of the fundamental mode. In this example, the optical signal is again transmitted to the semiconductor chip 150 where it is received by the photonic circuit 160. In this manner, a laser can be inline with a SOA 115 where the SOA 115 and many components of the laser—e.g., the HR coating 305, the gain region 110, and the AR coating 310—are formed on the same chip 105. The variable reflector 155, however, is formed on the separate chip 150 along with the photonic circuit 160.

Figure 5:
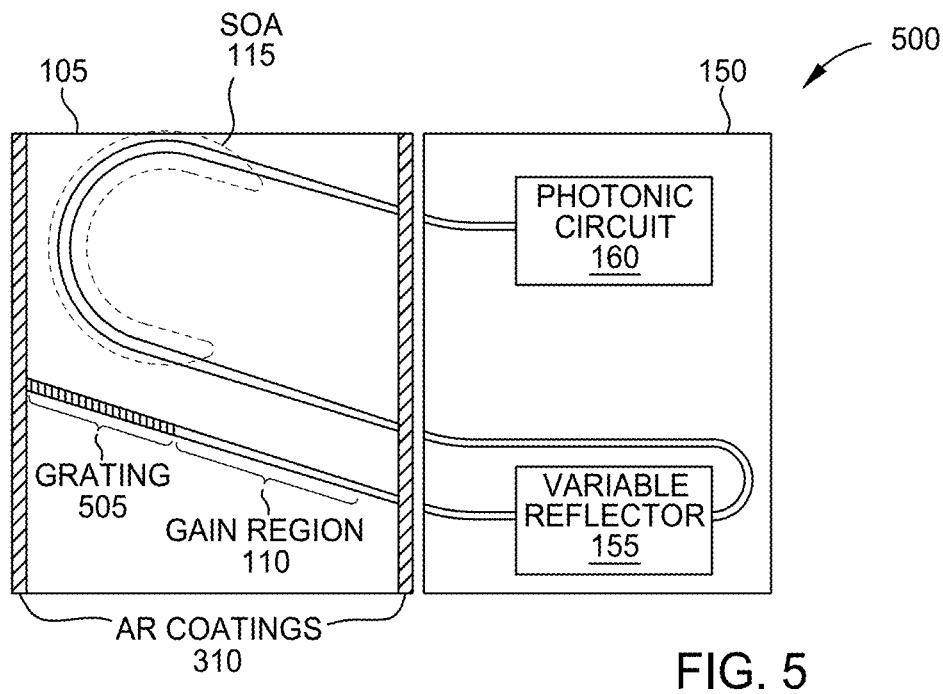
FIGS. 5-9 illustrate MOPAs formed using two semiconductor chips, according to embodiments described herein.

FIGS. 5-9 illustrate MOPAs formed using two different chips, according to embodiments described herein. FIG. 5 is a MOPA 500 similar to the MOPA 300 in FIG. 3 except that the HR coating on the left of the III-V chip 105 is replaced by an AR coating 310. Moreover, a grating 505 is disposed between the gain region 110 and the AR coating 310 on the left side of the III-V chip 105. The grating 505 may be a series of ridges that are etched into the chip 105. The ridges may be disposed above the SFW or below the SFW.

The grating 505 and the AR coating 310 on the left side of the chip 105 serve as a HR element for the laser formed by the gain region 110 and the variable reflector 155. That is, the light generated by the gain region 110 which passes through the SFW disposed under or above the grating 505 is reflected back towards the gain region 110. Besides this modification, the MOPA 500 operates in the same manner as the MOPA 300 and thus the other elements in FIG. 5 are not described in detail.

Figure 6:
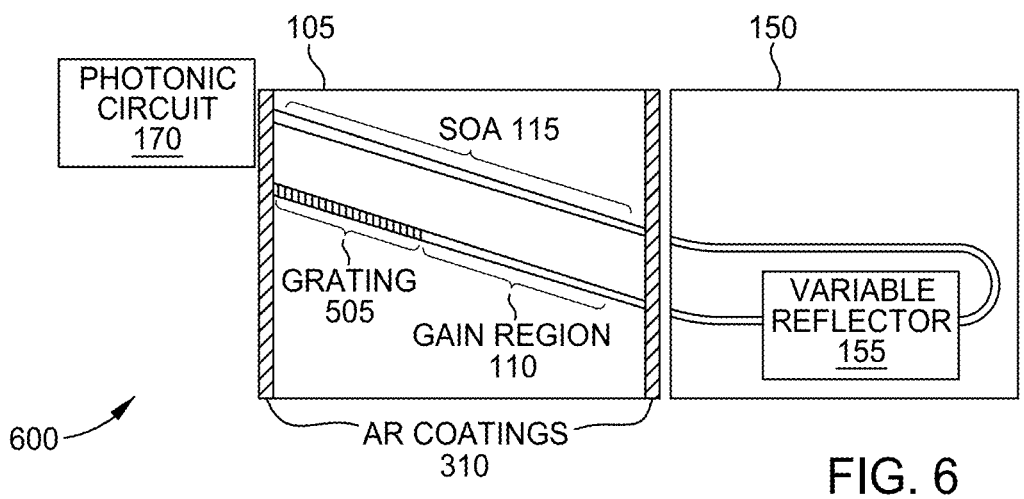

FIG. 6 illustrates a MOPA 600 similar to the MOPA 500 where the grating 505 and one of the AR coatings 310 is used as a HR element. However, in FIG. 6, the output of the SOA 115 is coupled to the left side or facet of the III-V chip 105 rather than the right side as shown in FIG. 5. As a result, the SFW in the SOA 115 is linear rather than forming a U-shape like in the previous embodiments.

The output of the SOA 115 is aligned to the photonic circuit 170 which itself may be disposed on a different semiconductor substrate (e.g., a silicon semiconductor chip). In one embodiment, the photonic circuit 170, the III-V chip 105, and the semiconductor chip 150 may be disposed on a common substrate or optical bench—e.g., a printed circuit board (PCB).

Figure 7:
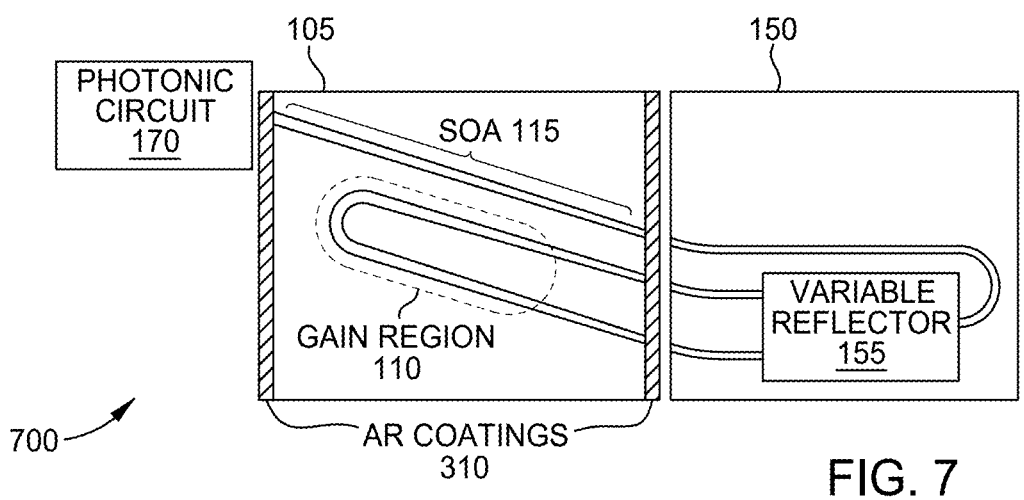

FIG. 7 illustrates a MOPA 700 with a ring laser formed from the gain region 110 and the variable reflector 155. As shown, the gain region 110 has two ends that terminate at the same facet (i.e., the right side of the chip 105). These two ends are aligned with two waveguides in the chip 150 which are coupled to the variable reflector 155. The combination of the gain region 110 and the variable reflector 155 form a ring cavity of the laser.

Some of the light entering the variable reflector 155 at one input is then transmitted the other input and back into the gain region 110 in the III-V chip. That is, some of the light entering one of the two inputs into the variable reflector 155 is transmitted back towards the gain region 110 using the other input. However, the remaining light exits through the output of the variable reflector 155 and is transmitted to the SOA 115 in the chip 105. Like in FIG. 6, the output of the SOA 115 is coupled to the photonic circuit 170 which may be part of a separate semiconductor chip.

Figure 8:
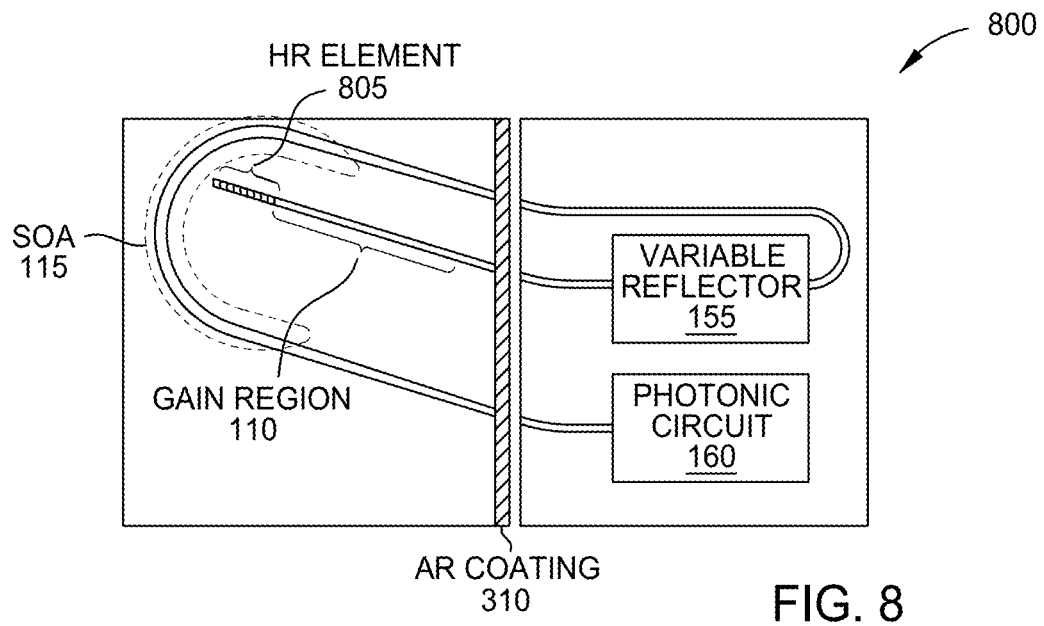

FIG. 8 illustrates a MOPA 800 that includes a gain region 110 that is enclosed by the SOA 115. As shown, the SOA 115 has a U-shape where the gain region 110 is disposed in the middle. In this embodiment, the laser uses a grating to form a HR element 805 which reflects the optical signal back into the gain region 110 and towards the variable reflector 155. Because the gain region 110 is enclosed by the SOA 115, the laser does not use a HR or AR coating on the left side, while there is an AR coating 310 on the right side of the III-V chip 105. In another embodiment, the MOPA 800 could use an etched (and possibly coated) facet (reflector) as the HR element 805 rather than a grating if the wavelength selectivity of the grating is not needed.

The output of the variable reflector 155 is coupled to the SOA 115 at a location that is above where the input of the variable reflector 155 couples to the gain region 110. The SOA 115 extends around the gain region 110 where the optical signal is retransmitted into the semiconductor chip 150 at a location that is below where the input of the variable reflector 155 couples to the gain region 110.

While FIG. 8 illustrates a U-shaped SOA 115, the SOA 115 could be linear such that the output is aligned to a photonic circuit disposed on the left side of the chip 105 rather than re-entering the semiconductor chip 150.

Figure 9:
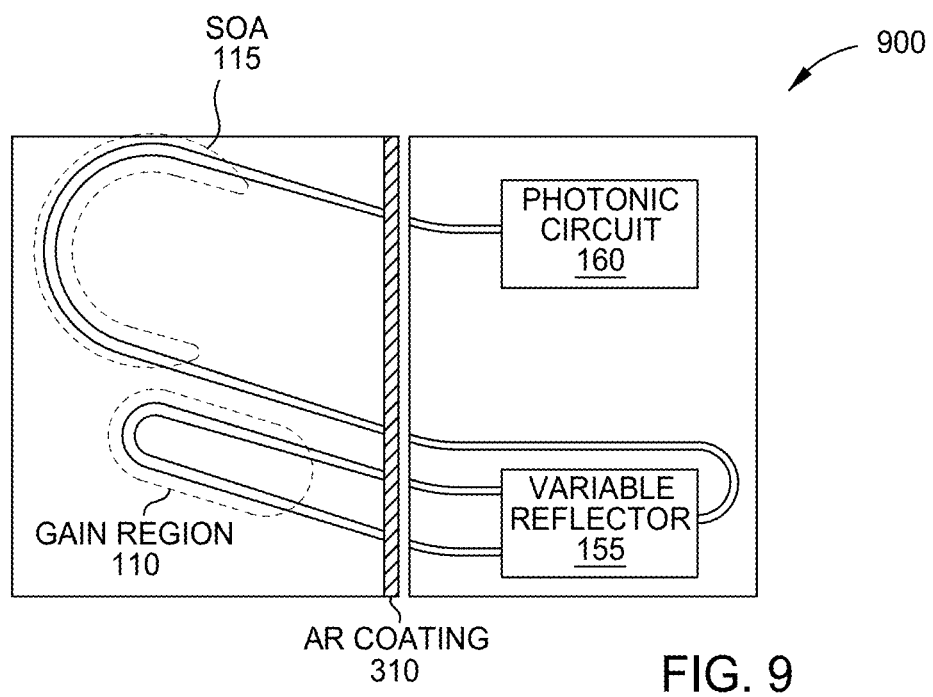

FIG. 9 illustrates a MOPA 900 where the gain region 110 and the variable reflector 155 form a ring cavity similar to the MOPA 700 in FIG. 7. However, in FIG. 9, the SOA 115 has a U-shape so that the amplified optical signal is transmitted back into the chip 150 and into the photonic circuit 160.

Figure 10:
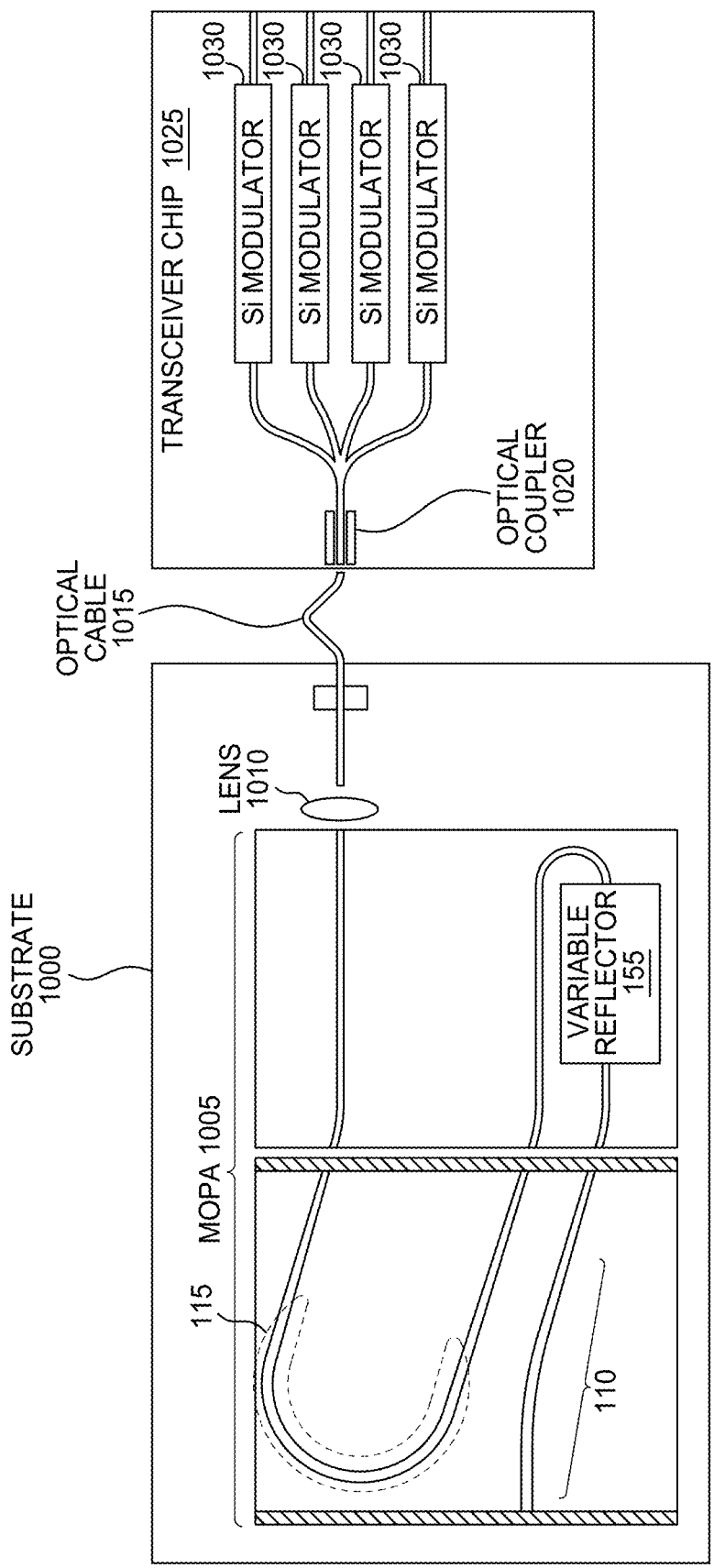
FIG. 10 illustrates an optical system that uses a MOPA as a laser source for a transceiver, according to one embodiment described herein.

FIG. 10 illustrates an optical system using a MOPA 1005 for a transceiver, according to one embodiment described herein. The MOPA 1005 includes a gain region 110 and a U-shaped SOA 115 in optical communication with the variable reflector 155. However, the MOPA 1005 could be any of the arrangements or configurations of the MOPAs described above. Further, the MOPA 1005 is disposed on a substrate 1000 (e.g., an optical bench).

In this embodiment, the output of the SOA 115 is coupled back into the same chip that includes the variable reflector 155, but this is not a requirement. For example, the SOA 115 could be linear in which case all the remaining components in the optical system in FIG. 10 would be disposed on the left side of the III-V chip rather than being on the right side of the chip containing the variable reflector 155 as shown.

The optical system includes a lens 1010 that is also disposed on the substrate 1000. The lens 1010 receives the amplified light from the semiconductor chip and aligns the signal with an optical cable 1015. The optical cable 1015 is in turn aligned with an optical coupler 1020 (e.g., a prong coupler) in a transceiver chip 1025. The optical signal is then split into a plurality of waveguides that each has a modulator 1030 for encoding data into the optical signals. That is, the modulators 1030 receive the CW optical signal generated by the MOPA 1005 (which is split into different CW signals) and modulate it to generate optical data signals. Due to the high optical power of the CW signal, one MOPA 1005 is sufficient to serve as a remote source for many optical channels.

While FIG. 10 illustrates using the MOPA 1005 as a remote source for a transceiver chip 1025, in another embodiment the MOPA can be used as a remote source for in-package optics.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A photonic device, comprising:
    a III-V semiconductor chip comprising:
        a gain region configured to generate an optical signal, wherein a first supermode filtering waveguide (SFW) is disposed in the gain region; and
        an optical amplifier configured to amplify the optical signal, wherein a second SFW is disposed in the optical amplifier, wherein the first and second SFWs comprises a first optical waveguide formed in a ridge that is stacked on a second optical waveguide, wherein the first optical waveguide comprises an active region that increases an intensity of the optical signal; and
    a substrate separate from the III-V semiconductor, the substrate comprising a variable reflector, wherein an input of the variable reflector is optically coupled to an output of the gain region and an output of the variable reflector is optically coupled to an input of the optical amplifier.

2. The photonic device of claim 1, further comprising a high reflective (HR) element disposed at a first end of the gain region that is opposite a second end of the gain region that is optically coupled to the variable reflector.

3. The photonic device of claim 2, wherein the HR element, the gain region, and the variable reflector form a cavity for a laser.

4. The photonic device of claim 1, wherein the output of the gain region and the input of the optical amplifier are optically coupled to a same facet of the III-V semiconductor chip, and wherein the input and the output of the variable reflector are coupled to a same facet of the substrate.

5. The photonic device of claim 1, wherein the first SFW extends through the gain region and terminates at a facet of the III-V semiconductor chip that is in a facing relationship with a facet of the substrate, wherein a width of the ridge in the first SFW decreases as the first SFW approaches the facet of the III-V semiconductor chip.

6. The photonic device of claim 5, wherein the second SFW extends through the optical amplifier and terminates at the facet of the III-V semiconductor chip that is in the facing relationship with the facet of the substrate, wherein a width of the ridge in the second SFW decreases as the second SFW approaches the facet of the III-V semiconductor chip.

7. The photonic device of claim 6, wherein a size of a fundamental mode in the first SFW is larger near the facet of the III-V semiconductor chip than in the gain region, and wherein a size of a fundamental mode in the second SFW is larger near the facet of the III-V semiconductor chip than in the optical amplifier.

8. The photonic device of claim 1, wherein the first SFW is at least one of linear and U-shaped in the gain region, and wherein the second SFW is at least one of linear and U-shaped in the optical amplifier.

9. The photonic device of claim 1, wherein an output of the optical amplifier is coupled to a photonic circuit disposed on the substrate.

10. The photonic device of claim 1, wherein an output of the optical amplifier is coupled to a side of the III-V semiconductor chip that is not in a facing relationship with the substrate.

11. The photonic device of claim 1, wherein the variable reflector is configured to reflect a portion of the optical signal received from the gain region back towards the gain region and transmit a remaining portion of the optical signal to the optical amplifier.

12. A photonic device, comprising:
    a III-V semiconductor chip comprising:
        a gain region configured to generate an optical signal;
        a high reflective (HR) element disposed at a first end of the gain region that is opposite a second end of the gain region that is optically coupled to a variable reflector; and
        an optical amplifier configured to amplify the optical signal; and
    a semiconductor chip comprising the variable reflector optically disposed between the gain region and the optical amplifier such that the optical signal generated by the gain region passes through the variable reflector to reach the optical amplifier.

13. The photonic device of claim 12, wherein the semiconductor chip comprises silicon.

14. The photonic device of claim 12, wherein the semiconductor chip further comprises a plurality of waveguides optically coupling the variable reflector to the gain region and the optical amplifier.

15. The photonic device of claim 12, wherein the variable reflector is configured to reflect a portion of the optical signal received from the gain region back towards the gain region and transmit a remaining portion of the optical signal to the optical amplifier.

16. A photonic device, comprising:
a semiconductor chip comprising:
   a gain region configured to generate an optical signal, and
   an optical amplifier configured to amplify the optical signal; and
a substrate with a side in a facing relationship with the semiconductor chip, the substrate comprising a variable reflector optically disposed between the gain region and the optical amplifier such that the optical signal generated by the gain region passes through the variable reflector to reach the optical amplifier; and
an anti-reflective (AR) coating between the gain region and the variable reflector and between the variable reflector and the optical amplifier.

17. The photonic device of claim 16 wherein the gain region and the optical amplifier comprise III-V semiconductor material.

18. The photonic device of claim 16, wherein the substrate is a silicon semiconductor chip comprising a plurality of waveguides coupling the variable reflector to the gain region and the optical amplifier.

19. The photonic device of claim 16, wherein the AR coating is disposed on a first side of the semiconductor chip and an HR coating is disposed on a second side of the semiconductor chip that is opposite the first side, wherein a first end of the gain region terminates at the AR coating and a second end of the gain region terminates at the HR coating.

20. The photonic device of claim 12, wherein the HR element comprises at least one of: an HR coating on a side of the III-V semiconductor chip, a grating in the III-V semiconductor chip, or a AR coating on a side of the III-V semiconductor chip.

* * * * *